United States Patent [19]

Barton et al.

[11] Patent Number: 5,014,900

[45] Date of Patent: May 14, 1991

[54] DEEP ACCESS BOND HEAD

[75] Inventors: Lowell R. Barton, Plano; Henry L. Humphrey, The Colony, both of Tex.

[73] Assignee: Texas Instruments Incorporated, Dallas, Tex.

[21] Appl. No.: 491,377

[22] Filed: Mar. 8, 1990

[51] Int. Cl.$^5$ .............................................. B23K 37/00
[52] U.S. Cl. ..................................... 228/4.5; 228/41; 228/904
[58] Field of Search ............... 228/1.1, 4.5, 904, 110, 228/179, 212, 41

[56] References Cited

U.S. PATENT DOCUMENTS

| | | | |
|---|---|---|---|
| 3,954,217 | 5/1976 | Smith | 228/1.1 |
| 4,202,482 | 5/1980 | Sade et al. | 228/1.1 |
| 4,527,730 | 7/1985 | Shirai et al. | 228/4.5 |
| 4,600,138 | 7/1986 | Hill | 228/4.5 |
| 4,789,093 | 12/1988 | Bansemir | 228/1.1 |

FOREIGN PATENT DOCUMENTS

| | | | |
|---|---|---|---|
| 33848 | 4/1981 | Japan | 228/4.5 |
| 95527 | 4/1989 | Japan | 228/4.5 |

Primary Examiner—Sam Heinrich
Attorney, Agent, or Firm—B. Peter Barndt; James T. Comfort; Melvin Sharp

[57] ABSTRACT

A wire bonder for bonding semiconductor packages that require a deep access to bond between the semiconductor device bond pads and the bonding area on the package to avoid interference between the bond head and the package pins, the bonder including a bellows actuated wire clamp, a reverse venturi to remove slack from the bonding wire, and a lengthened bonding tool.

14 Claims, 5 Drawing Sheets

DEEP ACCESS BOND HEAD

FIELD OF THE INVENTION

This invention relates to ultrasonic aluminum wire bonders for semiconductor devices, and more particularly to a bonder with a deep access head and with a bellows actuated wire clamp.

BACKGROUND OF THE INVENTION

Wire bonding on conventional semiconductor headers normally consists of bonding a wire on a bond pad on the semiconductor device and to a lead frame finger or a bond pad on the header. The bond pad on the semiconductor device and the bond area on the header are usually on about the same level, and the bond head of the bonder does not have to avoid any raised portions of the header. With the advent of pin grid array packages, some packages have the semiconductor bar on the same side of the package as that of the pins. This presents a problem with conventional type bond heads in that the package pins interfere with the bond head in bonding the bond wire from the bond pad on the semiconductor bar to a bond pad on the package.

Another problem in using pin grid array packages with conventional bonders is that the wire clamp must be such that it does not interfere with the bond process. The wire clamp must be small and placed such that it does not engage a pin on the package during bonding.

SUMMARY OF THE INVENTION

The invention defines a wire bonder with a deep access bond head capable of bonding pin array packages with the semiconductor bar cavity on the same side of the package as that of the pins. The bond head has an elongated bond tool and a small bellows actuated wire clamp behind the bond tool. The bellows actuated bond clamp is operated by applying compressed air to the bellows to clamp the wire. To release the wire, the air pressure is remove and a spring arm attached to One of the clamp jaws opens the wire clamp to release the wire.

Another feature of the invention is a reverse venturi to pull back on the bond wire to keep slack out of the wire as it is fed to the bond head and clamp. The reverse venturi is a vacuum apparatus through which the feed wire is fed and is mounted on the optics tube of the bonder.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
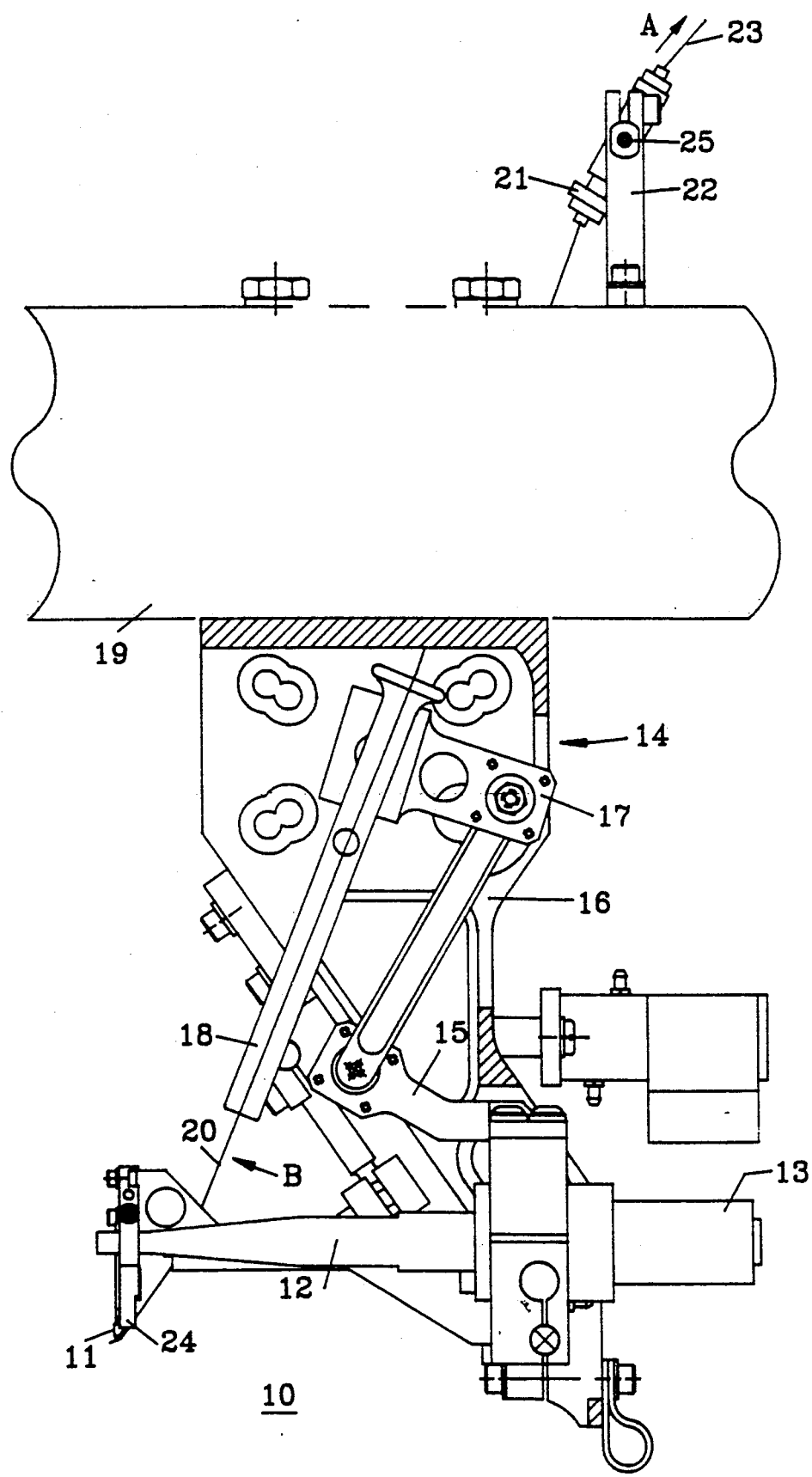
FIG. 1 is a side view of the bonder of the present invention.

FIG. 1 illustrates a side view of the bonder of the present invention. Bonder 10 includes a bond tool 11 attached to arm 12. Arm 12 is attached to sonic source 13 which provides the bonding energy. The bond head is positioned by drive motor 14 which actuates drive arms 15, 16 and 17. The sonic source, and arm 12 are moved by the drive lever 15, to which they are attached.

A bond wire 20 is fed through a reverse venturi device 21 mounted on support 22. Support 22 is mounted on the bonder optics tube 19. Bond wire extends through optics tube 19, feed tube 18, arm 12, and wire clamp 24 to bond tool 11.

As the bond head and bond tool 11 is moved from a bond on the semiconductor bar (not illustrated) to a bond area on a header package, wire 20 is pulled through the bond tool 11, clamp 24, feed tube 10 and venturi 21. After several bonds, slack will occur in wire 20. Air pressure is applied at input 25 to venturi 21 which creates a vacuum such that bond wire 20 is pulled back through feed tube 18 to remove slack that has formed in the bond wire.

The direction of pull on bond wire is shown by arrow "A". The direction is to move the bond wire end 23 towards a wire feed spool (not illustrated). Slack in the wire is removed at the feed wire location indicated by arrow "B" and any other location below venturi 21.

Figure 2:
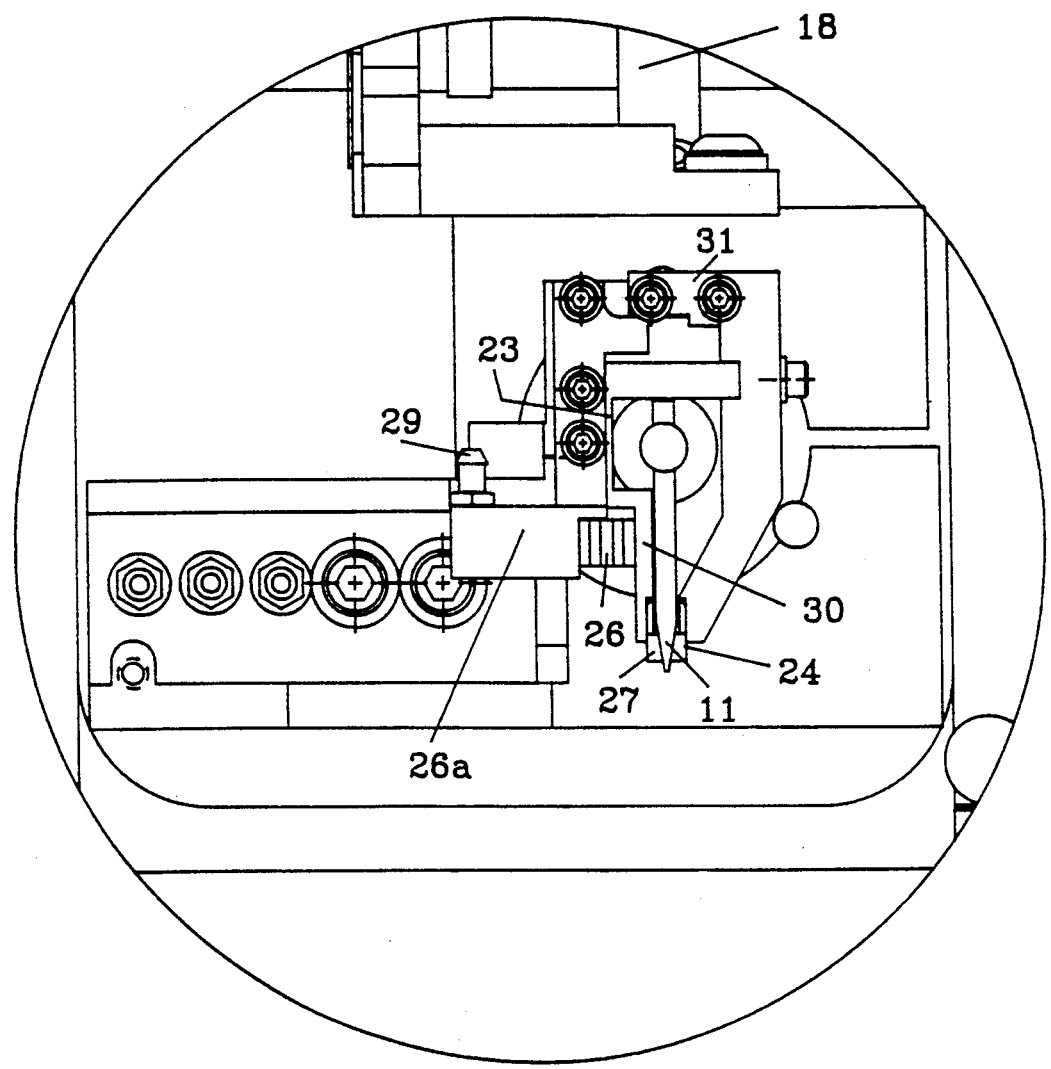
FIG. 2 is an enlarged partial front view of the bond head.

FIG. 2 is a partial front view of the bonder. Illustrated is the wire feed tube 18, arm 12 holding tool 11 and the wire clamp 24. Clamp 24 has a second clamp jaw 27. Jaw 27 is attached to arm 30 which is attached to clamp frame 31 by leaf spring 23. Detail of the clamping is shown in more detail below with reference to FIG. 3.

Figure 3:
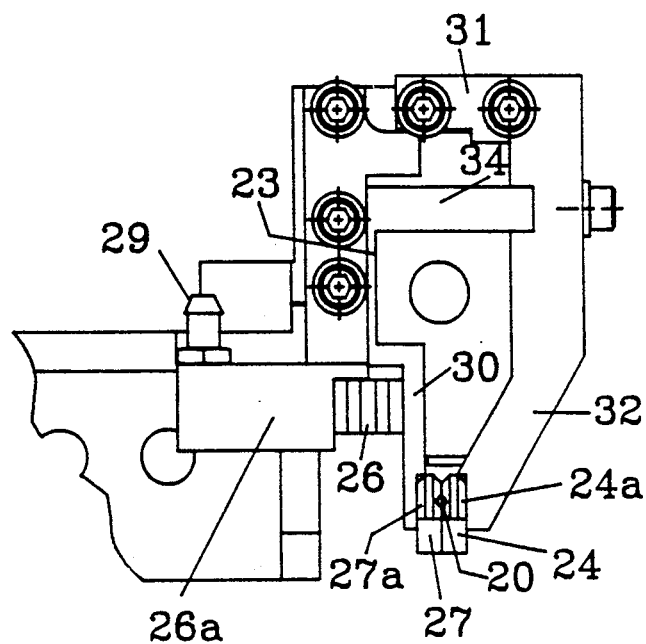
FIG. 3 is a front view of the bond head with the bond tool removed.

FIG. 3 is a partial front view of the bond head showing the wire clamp in more detail. The wire clamp assembly is made up of jaws 24 and 27, rigid arm 32 to which clamp 24 is attached, arm 30 to which clamp 27 is attached, and leaf spring 23, which is attached to clamp frame 34. In practice, arm 30, clamp frame 34 and leaf spring 23 are machined from a solid piece of material. The machining process provides the unique spring 23. Bellows 26 provides the clamping action. Bellows 26 is attached to fixed member 26a with an epoxy. The end of bellows 26 adjacent arm 30 is a closed end and is free to move against arm 30, but is not attached thereto.

Bond tool 11 has been removed to show both wire clamp jaws 24 and 27. Bond wire 20 is shown clamped between the faces 24a and 27a. Faces 24a and 27a are apart of the clamp jaws 24 and 27. In operation, the clamp is in an open position so that bond wire can move freely between the jaw faces 24a and 27a. When a bond is made to a bond pad on a semiconductor device, the bond head moves to feed out bond wire to a desired length. The bond wire is then bonded to a bonding area on the device package. There after the bond wire is clamped to break the wire at the last bond surface.

To clamp bond wire 20, pressurized air is introduced through inlet 29. The air pressure expands bellows 26 moving arm 30 and clamp face 27a attached to one end of the arm. The other clamp face 24a is held rigid by clamp frame 31 and arm 32 to securely clamp the bond wire. When it is desirable to release the bond wire 20, air pressure is removed and leaf spring 23, attached to arm 30 compresses bellows 26 moving wire clamp face 27a away from clamp face 24a, releasing bond wire 20.

Figure 4:
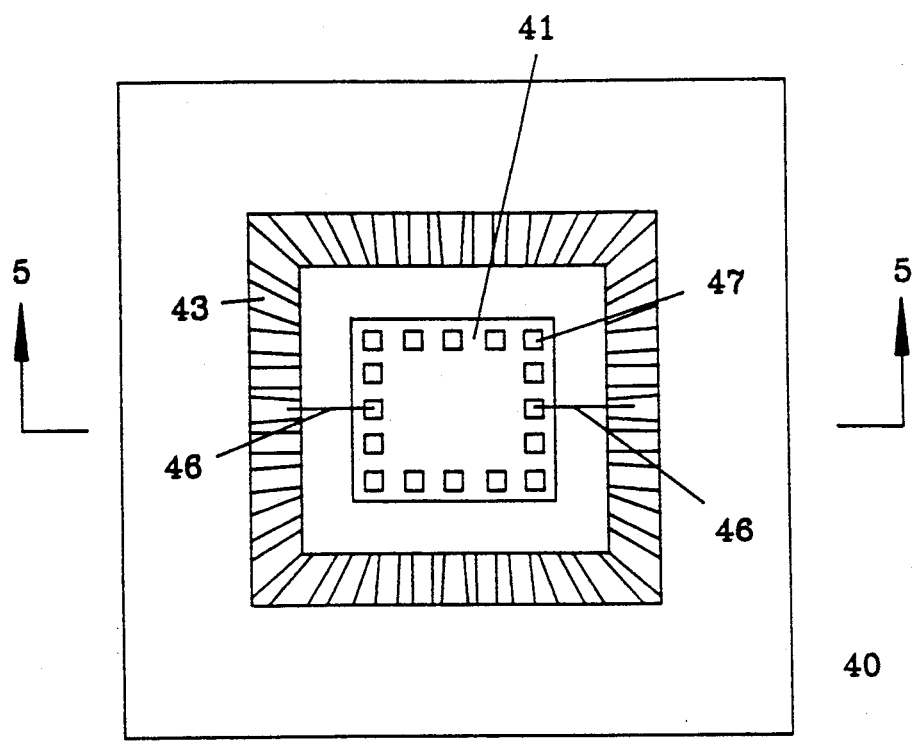
FIG. 4 is a top view of a pin array package.
Figure 5:
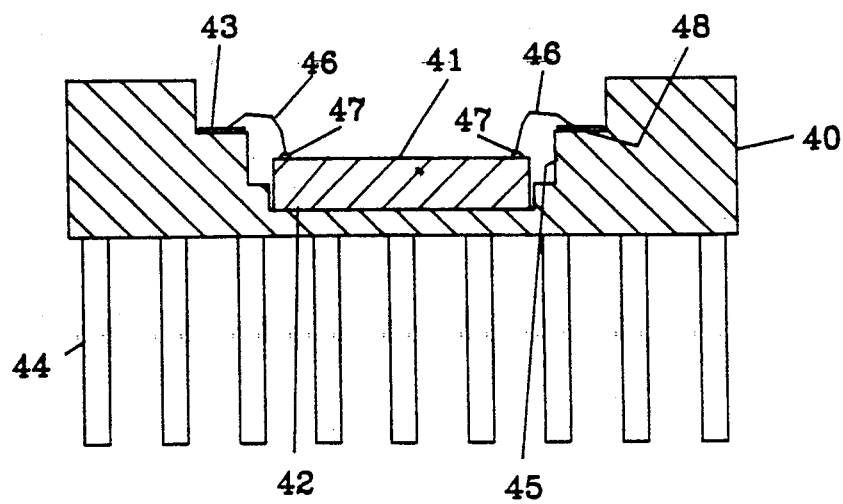
FIG. 5 is a cross-sectional side view of the pin array package of FIG. 4.

FIGS. 4 and 5 are top and cross-sectional side views of a pin grid array package. The package has a ceramic or plastic body 40 with a semiconductor mounting surface 42 recessed into the package. Semiconductor device 41 is mounted in recess 42 and has a plurality of bond pads arrayed about its outer edge. Each bond pad 47 has a bond wire 46 attached thereto, which is also attached to a respective bond pad 43 on ledge 48. In securing the bond wires to the bond area 43, the bonder bond head must clear wall 45 of the package, and when bonding the bond wire to one of the bond pads 47 on the semiconductor device 41, the ledge 48 must be cleared by the bond head.

In the package illustrated in FIGS. 4 and 5, the package pins extend from the bottom of the package. Each pin is connected to one of the bond areas 43 on ledge 48 by conducting paths within the package (not illustrated).

Figure 6:
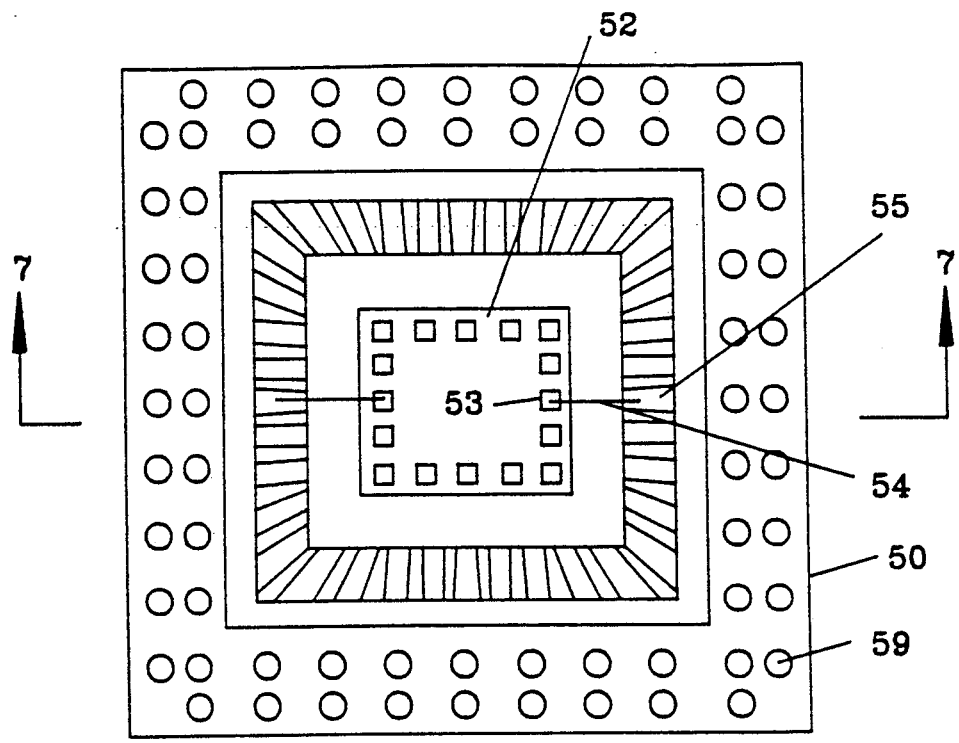
FIG. 6 is a top view of another pin array package.
Figure 7:
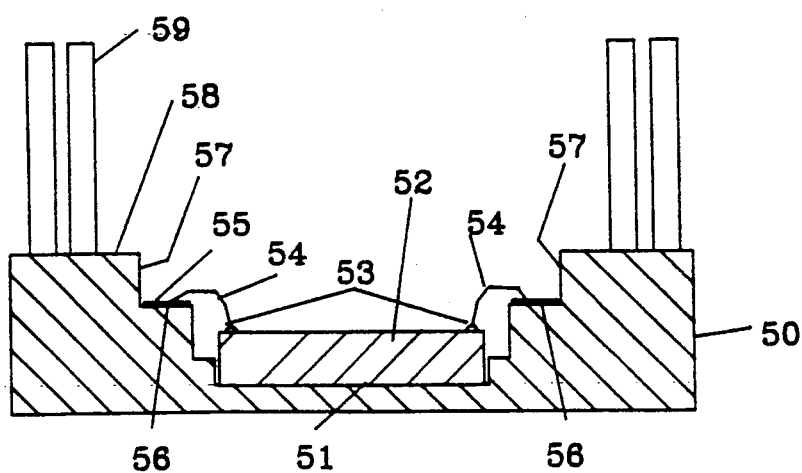
FIG. 7 is a cross-sectional side view of the pin array package of FIG. 6.

FIGS. 6 and 7 are top and cross-sectional views of another embodiment of a pin grid array package. Package 50 has a recess 51 therein in which semiconductor device 52 is mounted.

Semiconductor device 51 has an array of bond pads 53 around it outer edge. Each bond pad is connected by bond wire 54 to one bond area 55, there being a plurality of bond areas 55 around a ledge 56 in package 50. Package 50 has an array of package pins 59 extending out the top of the package, or the side of the package in which the semiconductor device 52 is mounted. This presents a problem in bonding the bond wires 54 since the bond head has to clear the pins 59 in order to bond the bond wires 54 to the bond areas 55 on ledge 56 of the package and to the bond pads 53 on the semiconductor device.

Figure 8:
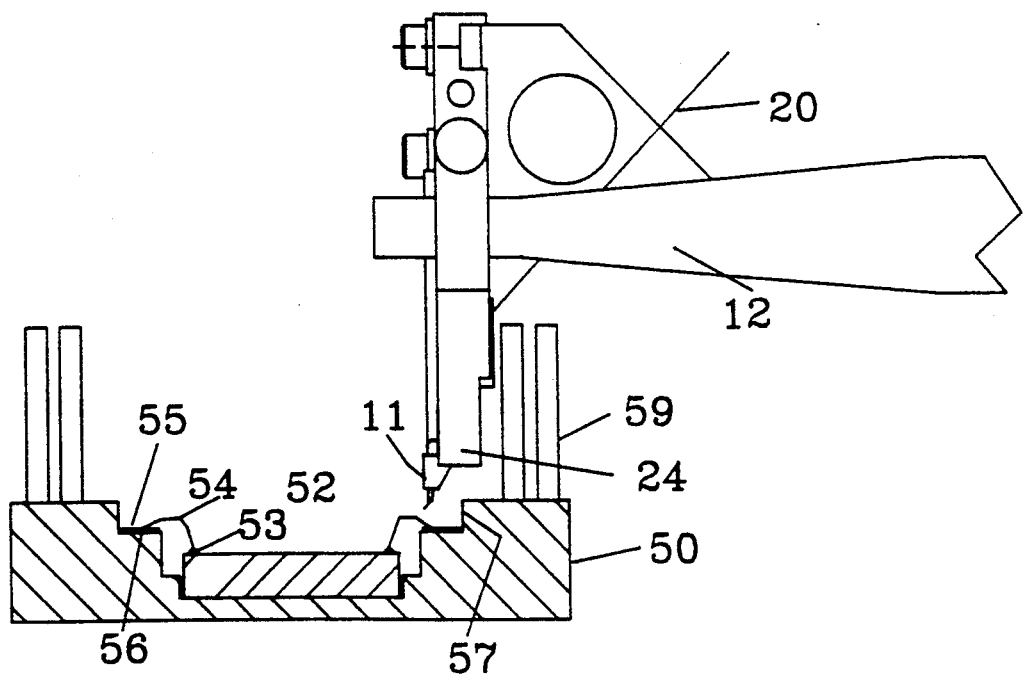
FIG. 8 illustrates the bond head positioned over a pin array package.

FIG. 8 illustrates the bond head of the present invention positioned over a pin grid array package. The bond head extends over the package 50 such that arm 12 extends over the pins 59, and bond tool 11 and bond wire clamp 24 extend downward, clearing pins 59, to the bond area 55 on package 50. The bond tool 11 and clamp 24,27 will also clear the pins 59 when the bond tool 11 is positioned over the bond pads 53 on semiconductor device 52. The extended length of bond tool 11 and the small size of bellows actuated clamp 24 allows the bond head to be positioned inside of the pins 59 to bond the bond wires 54 in place.

What is claimed:

1. A wire bonder for bonding semiconductor packages requiring a deep access bond head, comprising:
   a bonding tool;
   a wire clamp device mounted adjacent the bonding tool; and
   a bellows device for actuating the wire clamp device.

2. The wire bonder according to claim 1, wherein the bellows device is actuated by compressed air to clamp the bond wire.

3. The wire bonder according to claim 1, including a reverse venturi device for removing slack from the bonding wire.

4. The wire bonder according to claim 3, wherein the reverse venturi is actuated by an air pressure applied to the reverse venturi device.

5. The wire bonder according to claim 2, wherein the bond wire is clamped by applying compressed air to the bellows device, and is released by the motion of a leaf spring when compressed air is removed from the bellows device.

6. The wire bonder according to claim 1, wherein the wire clamp device consists of:
   a frame for supporting the clamping device;
   a first clamping jaw, having a clamping face, rigidly mounted on the frame;
   a leaf spring attached to the frame
   a movable arm attached to the leaf spring;
   a second clamping jaw, having a clamping face, attached to the movable arm;
   a bellows device attached adjacent to the movable arm for moving the second clamp jaw face into engagement with the first clamp jaw face.

7. The wire bonder according to claim 3, wherein the reverse venturi device for taking slack out of the bonding wire includes:
   a mounting frame;
   a venturi tube, having an opening therein through which the bonding wire extends, pivotally mounted on the mounting frame; and
   a port to which air pressure may be applied to move the bonding wire in a direction to remove slack from the wire.

8. A wire bonder for bonding semiconductor packages requiring a deep access bond head, comprising:
   an extended length bonding tool;
   a wire clamp device mounted adjacent the bonding tool;
   a bellows device for actuating the wire clamp device; and
   a venturi device for removing slack from the bonding wire.

9. The wire bonder according to claim 8, wherein the bellows device is actuated by compressed air to clamp the bond wire.

10. The wire bonder according to claim 8, wherein the reverse venturi is actuated by an air pressure applied to the reverse venturi device.

11. The wire bonder according to claim 9, wherein the bond wire is clamped by applying compressed air to the bellows device, and is released by the motion of a leaf spring when compressed air is removed from the bellows device.

12. The wire bonder according to claim 8, wherein the wire clamping device consists of:
   a frame for supporting the clamping device;
   a first clamping jaw, having a first clamping face, rigidly mounted on the frame;
   a leaf spring attached to the frame
   a movable arm attached to the leaf spring;
   a second clamping jaw, having a second clamping face, attached to the movable arm;
   a bellows device attached to the movable arm for moving the second clamping face into engagement with the first clamping face.

13. The wire bonder according to claim 8, wherein the reverse venturi device for taking slack out of the bonding wire includes:
   a mounting frame;
   a venturi tube, having an opening therein through which the bonding wire extends, pivotally mounted on the mounting frame; and a port to which air pressure may be applied to move the bonding wire in a direction to remove slack from the wire.

14. A wire bonder for bonding semiconductor packages requiring a deep access bond head, comprising:
   a bonding tool;
   a wire clamp device mounted adjacent the bonding tool, comprising:
   a frame for supporting the clamping device;
   a first clamping jaw, having a first clamping face, rigidly mounted on the frame;
   a leaf spring attached to the frame
   a movable arm attached to the leaf spring;
   a second clamping jaw, having a second clamping face, attached to the movable arm;
   a bellows device attached to the movable arm for moving the second clamp face into engagement with the first clamp face; and
   a venturi device for removing slack from the bonding wire between the bonding tool and the venturi device, comprising:
   a mounting frame;
   a venturi tube, having an opening therein through which the bonding wire extends, pivotally mounted on the mounting frame; and
   a port to which air pressure may be applied to move the bonding wire in a direction to remove slack from the wire.

* * * * *